(12) United States Patent
Iwamoto (10) Patent No.: US 10,263,038 B1
(45) Date of Patent: Apr. 16, 2019

(54) STORAGE DEVICE

(71) Applicant: TOSHIBA MEMORY CORPORATION, Tokyo (JP)

(72) Inventor: Toshiyuki Iwamoto, Mie Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/104,845

(22) Filed: Aug. 17, 2018

(30) Foreign Application Priority Data

Mar. 22, 2018 (JP) .................. 2018-055381

(51) Int. Cl.
*H01L 27/24* (2006.01)
*H01L 45/00* (2006.01)
*G11C 13/00* (2006.01)

(52) U.S. Cl.
CPC ...... *H01L 27/2436* (2013.01); *G11C 13/0021* (2013.01); *H01L 45/12* (2013.01); *H01L 45/141* (2013.01); *H01L 45/1616* (2013.01); *H01L 45/1675* (2013.01); *G11C 2213/79* (2013.01)

(58) Field of Classification Search
CPC ............. H01L 27/2427; H01L 27/2436; H01L 27/2472; H01L 27/249; H01L 45/146
See application file for complete search history.

(56) References Cited

U.S. PATENT DOCUMENTS

| 8,299,571 | B2 | 10/2012 | Ozawa et al. |
| 8,432,720 | B2 | 4/2013 | Awaya et al. |
| 8,642,985 | B2 | 2/2014 | Chen et al. |
| 9,564,587 | B1 * | 2/2017 | Jo ...................... G11C 13/0004 |
| 9,793,139 | B2 * | 10/2017 | Sharangpani ....... H01L 27/1157 |
| 10,115,897 | B1 * | 10/2018 | Sato .................... H01L 45/1253 |

\* cited by examiner

*Primary Examiner* — Allison Bernstein
(74) *Attorney, Agent, or Firm* — Kim & Stewart LLP (57) ABSTRACT

A storage device includes a substrate, first and second insulation layers extending in a first direction, a first conductive layer extending in the first direction between the first and second insulation layers in a second direction perpendicular to the substrate, a second conductive layer extending in the second direction, a variable resistance layer provided between the first and second conductive layers, and a first layer having a first surface contacting the first insulating layer and a second surface contacting the resistance-variable layer in a third direction. The first surface has an incline with respect to the third direction from a first portion to a second portion that is closer to the second surface than the first portion. A distance between the first portion and the second insulating layer in the second direction is larger than a distance between the second portion and the second insulating layer.

20 Claims, 9 Drawing Sheets

STORAGE DEVICE

CROSS-REFERENCE TO RELATED APPLICATION

This application is based upon and claims the benefit of priority from Japanese Patent Application No. 2018-055381, filed Mar. 22, 2018, the entire contents of which are incorporated herein by reference.

FIELD

Embodiments described herein relate generally to a storage device.

BACKGROUND

As a large-capacity nonvolatile memory, a two-terminal resistive random access memory has been actively developed to replace a floating-gate-type NAND flash memory of the related art. This type of memory enables a low-voltage/low-current operation, high speed switching, and miniaturization and high integration of memory cells.

In a large-capacity memory array, a large number of metal wirings, called bit lines and word lines, are arranged to intersect each other, and a memory cell is formed at each intersection of the bit lines and the word lines. Writing to one memory cell is performed by applying a voltage to the bit line BL and the word line WL, which are connected to the cell.

DETAILED DESCRIPTION

Embodiments provide a storage device with reduced memory cell current relative to storage devices of the related art.

In general, according to one embodiment, a storage device includes a substrate, a first insulation layer extending in a first direction, a second insulation layer extending in the first direction, a first conductive layer extending in the first direction and provided between the first insulation layer and the second insulation layer in a second direction perpendicular to the substrate and intersecting the first direction, a second conductive layer extending in the second direction, a variable resistance layer provided between the first conductive layer and the second conductive layer, and a first layer having a first surface in contact with the first insulating layer and a second surface contiguous with the first surface and in contact with the resistance-variable layer in a third direction intersecting the first direction and the second direction. The first surface has an incline with respect to the third direction from a first portion to a second portion that is closer to the second surface than the first portion, such that a part of the first insulating layer is between the first portion and the resistance-variable layer in the third direction and a first distance between the first portion and the second insulating layer in the second direction is larger than a second distance between the second portion and the second insulating layer.

Hereinafter, embodiments of the present disclosure will be described with reference to the drawings. In addition, in the drawings, the same or similar reference numerals are attached to the same or similar parts.

In the present specification, in order to indicate a positional relationship of parts, for example, the upward direction of the drawing is described as "upper" and the downward direction of the drawing is described as "lower". In the present specification, however, the concepts of "upper" and "lower" are not necessarily terms indicating a relationship with direction of gravity.

First Embodiment

A storage device of the first embodiment includes a substrate, a first insulation layer extending in a first direction, a second insulation layer extending in the first direction, a first conductive layer extending in the first direction and provided between the first insulation layer and the second insulation layer in a second direction perpendicular to the substrate, a second conductive layer extending in the second direction, a variable resistance layer provided between the first conductive layer and the second conductive layer, and a first layer including a first surface, which faces the first insulation layer or the second insulation layer, and a second surface, which is in series with the first surface and is in contact with the variable resistance layer in a third direction intersecting the first direction and the second direction, the first surface having a first point, which is spaced apart from the variable resistance layer in the third direction, so as to be inclined relative to the second surface so that a first distance in the second direction between the first insulation layer and the second insulation layer is greater at the first point than a second distance of the second surface in the second direction.

In addition, the storage device of the first embodiment includes a substrate, a first conductive layer extending in a first direction, a second conductive layer extending in a second direction perpendicular to the substrate and spaced apart from the first conductive layer in a third direction so as to face to the first conductive layer, a variable resistance layer provided between the first conductive layer and the second conductive layer and extending in the second direction, and a first layer provided at least between the first conductive layer and the variable resistance layer, wherein the storage device is configured to store information based on variation in a resistance value of the second conductive layer in the second direction, which is based on variation in a resistance value of an area between the first conductive layer and the second conductive layer caused by applying a voltage between the first conductive layer and the second conductive layer, and wherein the first layer includes a first surface, which is spaced apart from the second conductive layer and is inclined such that a length of the first layer in the second direction increases as the distance to the first conductive layer decreases.

Figure 1:
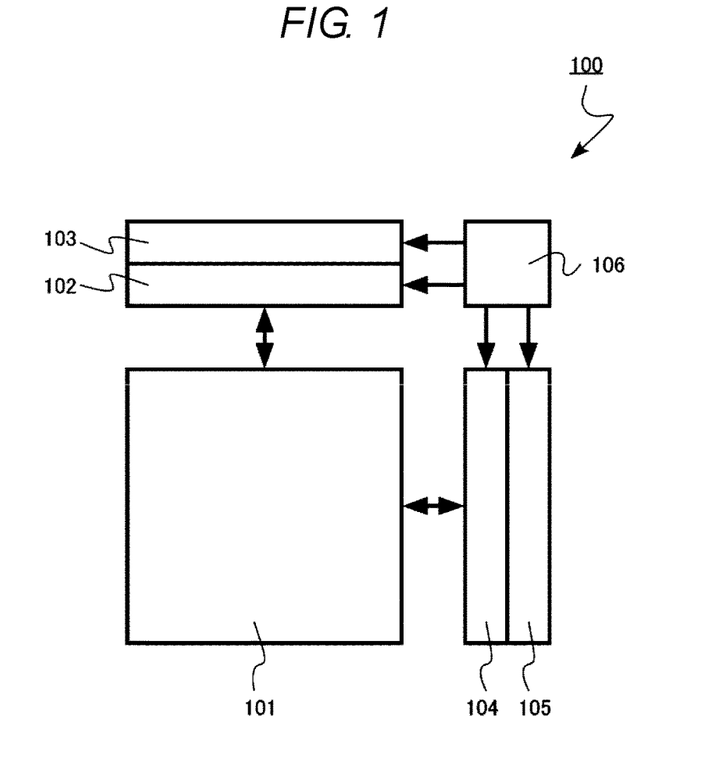
FIG. 1 is a block diagram of a storage device according to a first embodiment.
Figure 2:
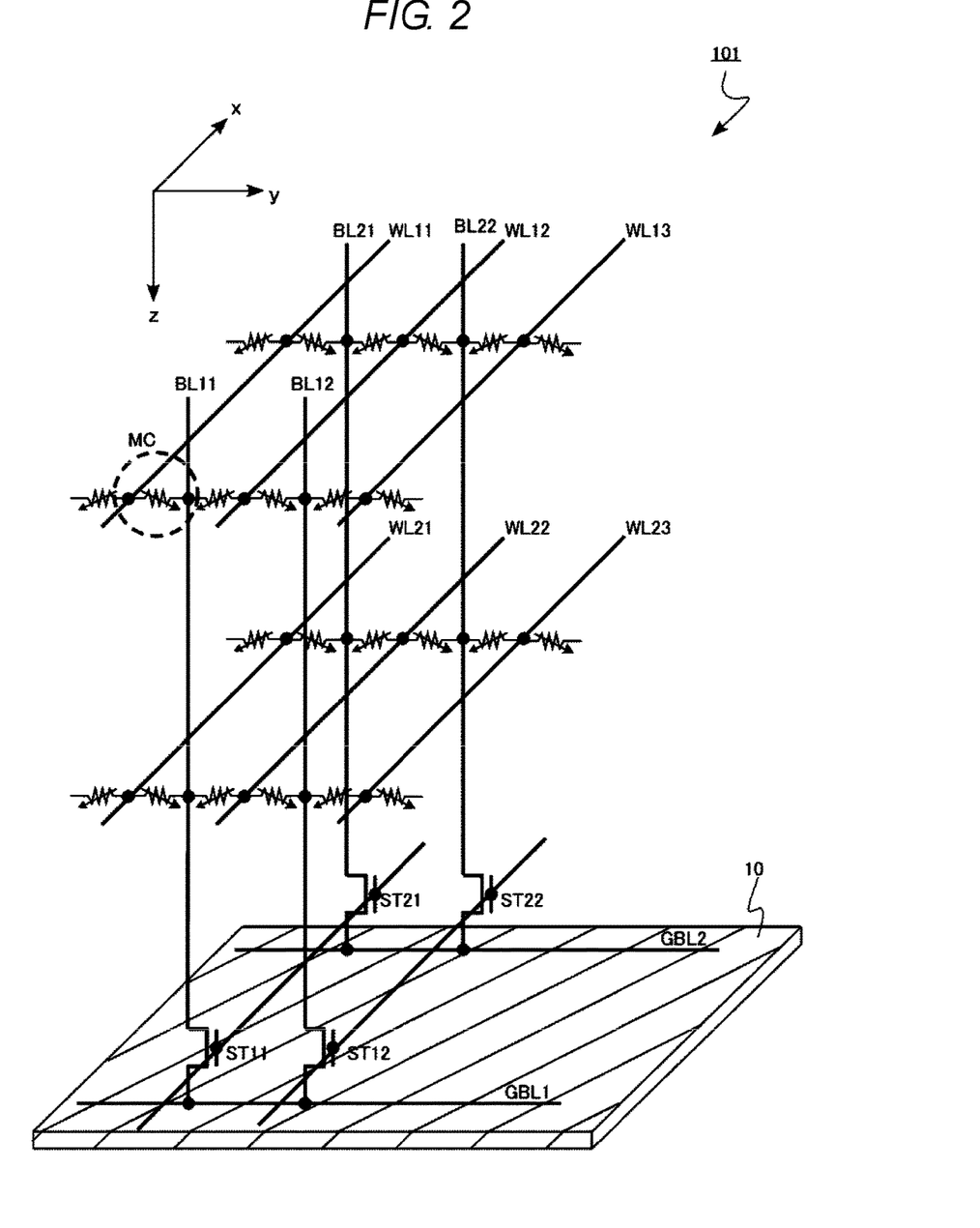
FIG. 2 is a schematic diagram illustrating an arrangement of a substrate and an equivalent circuit of a memory cell array according to the first embodiment.

FIG. 1 is a block diagram of a storage device 100 according to the first embodiment. FIG. 2 is a schematic diagram illustrating an arrangement of a substrate 10 and an equivalent circuit of a memory cell array 101. FIG. 2 schematically illustrates a wiring structure in the memory cell array 101.

The storage device 100 of the first embodiment is a resistive random access memory. The resistive random access memory stores data using variation in the resistance of a recording layer depending on the application of a voltage.

In addition, the memory cell array 101 of the first embodiment has a three-dimensional structure in which memory cells are three-dimensionally arranged. By providing a three-dimensional structure, the degree of integration of the storage device 100 is improved.

As illustrated in FIG. 1, the storage device 100 includes the memory cell array 101, a word line driver circuit 102, a row decoder circuit 103, a sense amplifier circuit 104, a column decoder circuit 105, and a control circuit 106.

In addition, as illustrated in FIG. 2, a plurality of memory cells MC is three-dimensionally arranged in the memory cell array 101. In FIG. 2, an area surrounded by the broken line circle corresponds to one memory cell MC.

The memory cell array 101 includes, for example, a plurality of word lines WL (WL11, WL12, WL13, WL21, WL22 and WL23) and a plurality of bit lines BL (BL11, BL12, BL21 and BL22). The word lines WL extend in the x direction. The bit lines BL extend in the z direction which is perpendicular to and intersects the x direction. The memory cells MC are arranged at intersections of the word lines WL and the bit lines BL.

For ease of reference, the x direction is also referred to herein as a first direction, the z direction as a second direction, and the y direction, which is perpendicular to and intersects the x direction and the z direction, as a third direction.

The plurality of word lines WL is electrically connected to the row decoder circuit 103. The plurality of bit lines BL is connected to the sense amplifier circuit 104. Selection transistors ST (ST11, ST21, ST12 and ST22) and global bit lines GBL (GBL1 and GBL 2) are provided between the plurality of bit lines BL and the sense amplifier circuit 104. The global bit lines GBL extend parallel to a substrate surface, for example, to a surface of the substrate 10 that is disposed parallel to the xy plane.

The row decoder circuit 103 has a function of selecting the word line WL in response to an input row address signal.

The word line driver circuit 102 has a function of applying a predetermined voltage to the word line WL selected by the row decoder circuit 103.

The column decoder circuit 105 has a function of selecting the bit line BL in response to an input column address signal. The sense amplifier circuit 104 has a function of applying a predetermined voltage to the bit line BL selected by the column decoder circuit 105. In addition, the sense amplifier circuit 104 has a function of detecting and amplifying the current flowing between the selected word line WL and the selected bit line BL.

The control circuit 106 has functions of controlling the word line driver circuit 102, the row decoder circuit 103, the sense amplifier circuit 104, the column decoder circuit 105, and other circuits (not illustrated).

The circuits such as, for example, the word line driver circuit 102, the row decoder circuit 103, the sense amplifier circuit 104, the column decoder circuit 105, and the control circuit 106 are electronic circuits. For example, the electronic circuits are configured with wiring layers and transistors using semiconductor layers (not illustrated).

Figure 3:
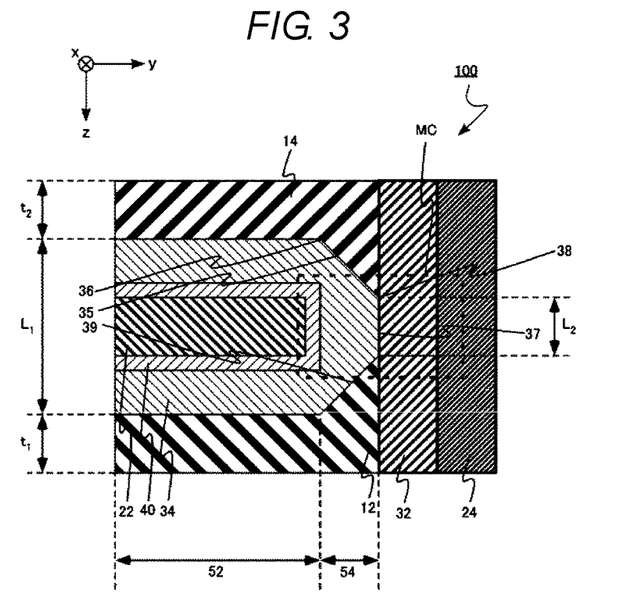
FIG. 3 is a schematic cross-sectional view of a part of the memory cell array of the storage device according to the first embodiment.

FIG. 3 is a schematic cross-sectional view of a part of the memory cell array 101 of the storage device 100 according to the first embodiment.

The storage device 100 includes a first insulation layer 12, a second insulation layer 14, a first conductive layer 22, a second conductive layer 24, a variable resistance layer 32, a first layer 34, and a barrier metal 40.

The first insulation layer 12 and the second insulation layer 14 extend in the x direction.

The first insulation layer 12 and the second insulation layer 14 include, for example, an oxide, an oxynitride, or a nitride. The first insulation layer 12 and the second insulation layer 14 are, for example, silicon oxide ($SiO_2$) layers.

The first conductive layer 22 extends in the x direction. The first conductive layer 22 is provided between the first insulation layer 12 and the second insulation layer 14 in the z direction perpendicular to the substrate 10.

The second conductive layer 24 extends in the z direction.

The first conductive layer 22 is the word line WL. The second conductive layer 24 is the bit line BL.

The first conductive layer 22 and the second conductive layer 24 are conductive layers. The first conductive layer 22 and the second conductive layer 24 are, for example, metal layers. The first conductive layer 22 and the second conductive layer 24 include, for example, tungsten, titanium nitride, or copper. The first conductive layer 22 and the second conductive layer 24 may be formed of a conductive material such as, for example, any other metal, a metal semiconductor compound, or a semiconductor.

The word lines WL are arranged in the y direction at an interval of, for example, 50 nm or more and 200 nm or less. The thickness of the word lines WL in the z direction is, for example, 30 nm or less. The bit lines BL are arranged in the x direction at an interval of, for example, 50 nm or more and 200 nm or less.

The interval of the word lines WL in the y direction, the thickness of the word lines WL in the z direction, and the interval of the bit lines BL in the x direction may be measured by observation using a transmission-type electron microscope, for example.

The variable resistance layer 32 is formed between the first insulation layer 12 and the second conductive layer 24, between the first conductive layer 22 and the second conductive layer 24, and between the second insulation layer 14 and the second conductive layer 24.

The first layer 34 is formed between the first insulation layer 12 and the first conductive layer 22, between the first conductive layer 22 and the variable resistance layer 32, and between the first conductive layer 22 and the second insulation layer 14.

In other words, the first layer 34 includes a first surface 35, which faces the second insulation layer 14, and a second surface 37, which is contiguous with the first surface 35 and is in contact with the variable resistance layer 32 in the y direction. The first surface 35 has a first point 36, which is spaced apart from the variable resistance layer 32 in the y direction, at which the first surface 35 becomes inclined relative to the second surface 37, so that a first distance $L_1$ in the z direction between the first insulation layer 12 and the second insulation layer 14 is greater than a second distance $L_2$ of the second surface 37 in the z direction.

The variable resistance layer 32 includes titanium oxide, tungsten oxide, or niobium oxide. The variable resistance layer 32 is a transition metal oxide. The film thickness of the variable resistance layer 32 may be, for example, 4 nm or more, in order to obtain good crystallinity.

The first layer 34 includes, for example, silicon or germanium. The first layer 34 is, for example, silicon, silicon germanium, or germanium layer. The first layer 34 is, for example, an amorphous silicon layer. The film thickness of the first layer 34 may be 3.5 nm or more, in order to obtain a good film quality, and may be 10 nm or less, in order to prevent an increase in operation voltage.

In FIG. 3, a region surrounded by the broken line rectangle corresponds to one memory cell MC.

The barrier metal 40 is provided between the first conductive layer 22 and the first layer 34. The barrier metal 40 includes, for example, titanium nitride.

A first area 52 is an area that extends in the x direction and the z direction, and the variable resistance layer 32 is provided between the first area 52 and the second conductive layer 24.

A second area 54 is an area that extends in the x direction and the z direction, and is provided between the first area 52 and the variable resistance layer 32.

The first layer 34 extends in the x direction so as to be provided between the first conductive layer 22 and the first insulation layer 12 and between the first conductive layer 22 and the second insulation layer 14 in the z direction.

In addition, the first surface 35 has a second point 38 connected to the second surface, and the distance between the first point 36 and the variable resistance layer 32 is greater than the distance between the second point 38 and the variable resistance layer 32.

In addition, the first surface 35 faces the first insulation layer 12, the first layer 34 further includes a third surface 39, which is contiguous with the second surface 37 and is spaced apart from the first surface 35, and the first insulation layer 12 is provided between the variable resistance layer 32 and the third surface 39.

In the storage device 100 of the first embodiment illustrated in FIG. 3, the first distance $L_1$ between the first insulation layer 12 and the second insulation layer 14 is constant in the first area 52. The second distance $L_2$ between the first insulation layer 12 and the second insulation layer 14 in the second area 54 decreases as the distance to the variable resistance layer 32 decreases.

In other words, a film thickness $t_1$ of the first insulation layer 12 is constant in the first area 52. The film thickness $t_1$ of the first insulation layer 12 increases in the second area region 54 as the distance to the variable resistance layer 32 decreases.

In addition, the film thickness $t_2$ of the second insulation layer 14 is constant in the first area 52. The film thickness $t_2$ of the second insulation layer 14 increases in the second area 54 as the distance to the variable resistance layer 32 decreases.

The first distance $L_1$ between the first insulation layer 12 and the second insulation layer 14 in the first area 52 may be 100 nm or less.

The second distance $L_2$ between the first insulation layer 12 and the second insulation layer 14 in the second area 54 may be, for example, 5 nm or more and 50 nm or less, and more particularly, may be 10 nm or more and 20 nm or less.

Figure 4:
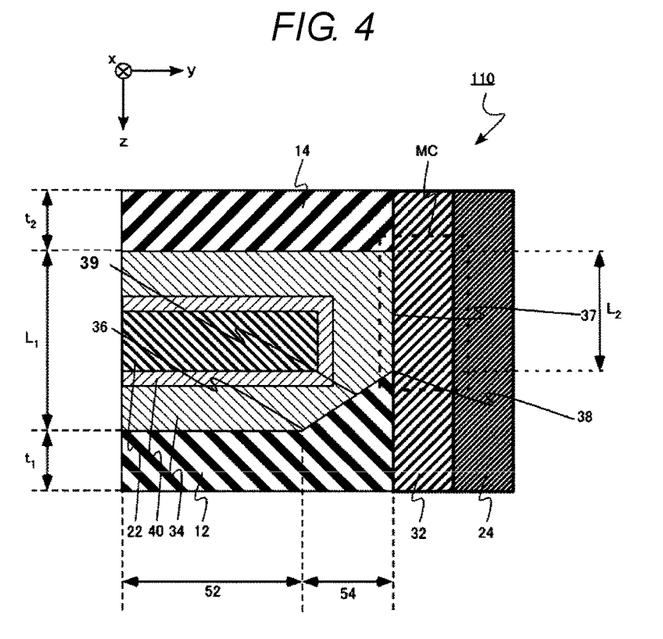
FIG. 4 is a schematic cross-sectional view of a part of a memory cell array of a storage device according to a first modification of the first embodiment.

FIG. 4 is a schematic cross-sectional view of a part of a memory cell array of a storage device 110 according to a first modification of the first embodiment.

In the storage device 110, the film thickness $t_2$ of the second insulation layer 14 is constant in the first area 52 and the second area 54. The film thickness $t_1$ of the first insulation layer 12 is constant in the first area 52. The film thickness $t_1$ of the first insulation layer 12 increases in the second area 54 as the distance to the variable resistance layer 32 decreases. In other words, the film thickness $t_2$ of the second insulation layer 14 is constant, and the first surface 35 is not provided on the second insulation layer 14.

Figure 5:
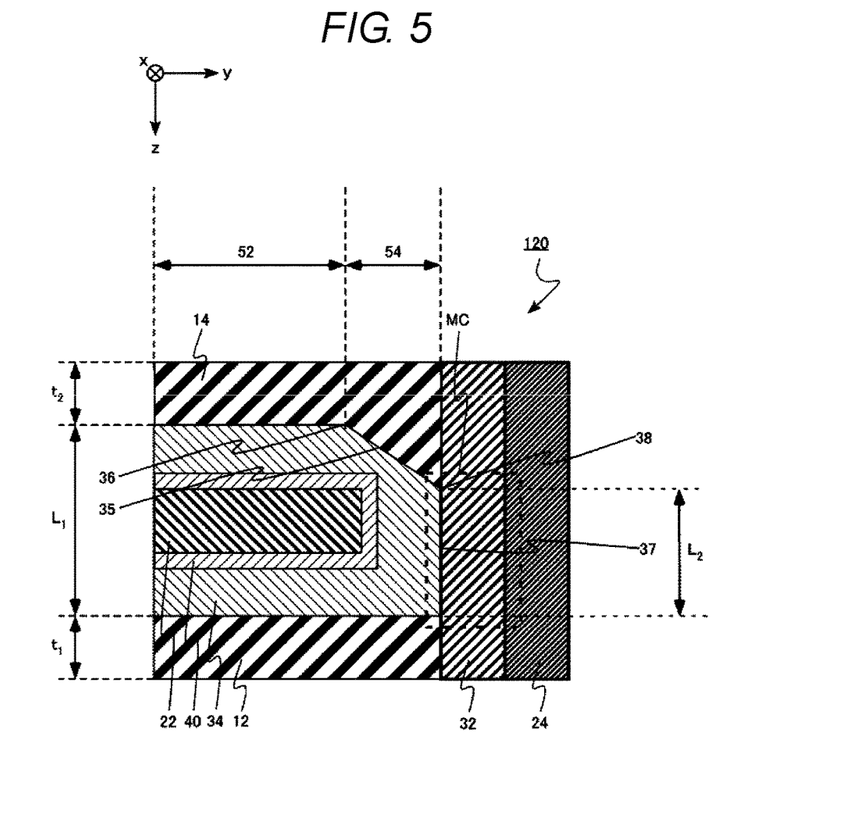
FIG. 5 is a schematic cross-sectional view of a major part of a memory cell array of a storage device according to a second modification of the first embodiment.

FIG. 5 is a schematic cross-sectional view of a part of a memory cell array of a storage device 120 according to a second modification of the first embodiment.

In the storage device 120, the film thickness $t_1$ of the first insulation layer 12 is constant in the first area 52 and the second area 54. The film thickness $t_2$ of the second insulation layer 14 is constant in the first area 52. The film thickness $t_2$ of the second insulation layer 14 increases in the second area 54 as the distance to the variable resistance layer 32 decreases. In other words, the film thickness $t_1$ of the first insulation layer 12 is constant, and the third surface 39 is not provided on the first insulation layer 12.

FIGS. 6A to 6G are schematic cross-sectional views illustrating a manufacturing method of a storage device according to a second embodiment.

The method of manufacturing the storage device of the second embodiment includes forming a first insulation layer, a first sacrificial layer, a second sacrificial layer, a third sacrificial layer, and a second insulation layer, forming a memory hole through the first insulation layer, the first sacrificial layer, the second sacrificial layer, the third sacrificial layer, and the second insulation layer, forming a first recording layer in the memory hole by oxidizing the first sacrificial layer, the second sacrificial layer, and the third sacrificial layer on the side surface of the memory hole by a radical oxidation method, forming a second conductive layer in the memory hole in which the recording layer has been formed, forming a hole by removing the first sacrificial layer, the second sacrificial layer, and the third sacrificial layer, and forming a second recording layer, a barrier metal, and a first conductive layer in the hole by removing a portion of a first oxidized area.

Figure 6A:
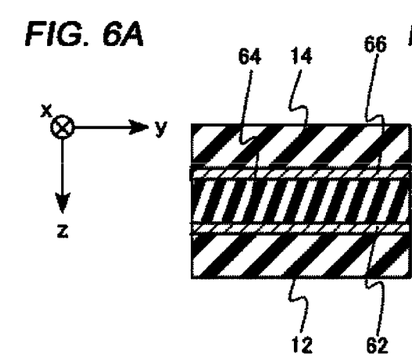
FIGS. 6A to 6G are schematic cross-sectional views illustrating a method of manufacturing a storage device according to a second embodiment.

First, as illustrated in FIG. 6A, the first insulation layer 12, a first sacrificial layer 62, a second sacrificial layer 64, a third sacrificial layer 66, and the second insulation layer 14 are formed.

The first sacrificial layer 62 and the third sacrificial layer 66 include, for example, polysilicon or amorphous silicon. The first sacrificial layer 62 and the third sacrificial layer are, for example, amorphous silicon. The second sacrificial layer 64 includes, for example, a nitride. The second sacrificial layer 64 is, for example, silicon nitride.

Figure 6B:
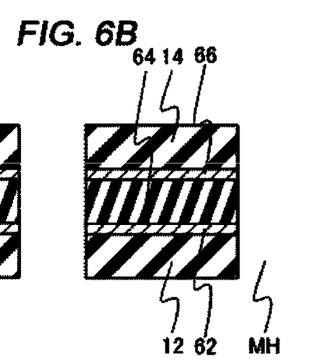

Subsequently, as illustrated in FIG. 6B, a memory hole MH is formed through the first insulation layer 12, the first sacrificial layer 62, the second sacrificial layer 64, the third sacrificial layer 66, and the second insulation layer 14.

Figure 6C:
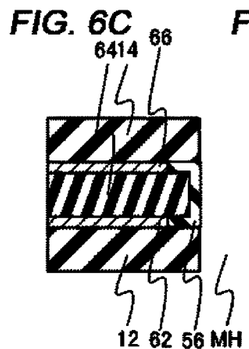

Subsequently, as illustrated in FIG. 6C, the first sacrificial layer 62, the second sacrificial layer 64, and the third sacrificial layer 66 on the side surface of the memory hole MH are oxidized by a radical oxidation method. A portion of the first sacrificial layer 62 in contact with the memory hole MH, a portion of the second sacrificial layer 64 in contact with the memory hole MH, and a portion of the third sacrificial layer 66 in contact with the memory hole MH are oxidized by the radical oxidation method to form a first oxidized area 56.

Here, the rate of radical oxidation of polysilicon or amorphous silicon is higher than the rate of radical oxidation of a nitride. Therefore, the first oxidized area 56 is formed more in the first sacrificial layer 62 and the third sacrificial layer 66 than in the second sacrificial layer 64.

Subsequently, the variable resistance layer 32 is formed in the memory hole MH.

Figures 6D, 6E:
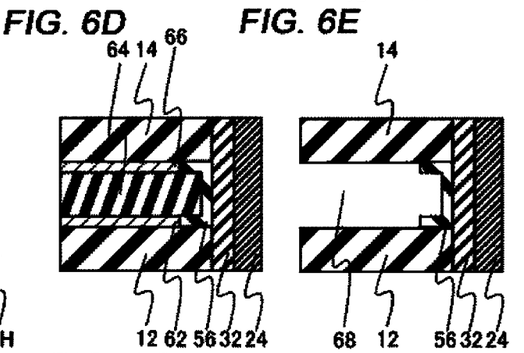

Subsequently, as illustrated in FIG. 6D, the second conductive layer 24 is formed in the memory hole MH in which the variable resistance layer 32 has been formed.

Subsequently, as illustrated in FIG. 6E, the first sacrificial layer 62, the second sacrificial layer 64, and the third sacrificial layer 66 are removed to form a hole 68.

Figure 6F:
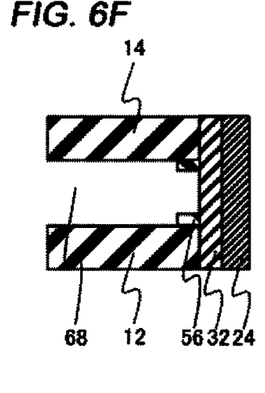

Subsequently, as illustrated in FIG. 6F, a portion of the first oxidized area 56 is removed by wet etching to expose the variable resistance layer 32. A portion of the first oxidized area 56 on the first insulation layer 12 side becomes a part of the first insulation layer 12, and a portion of the first oxidized area 56 on the second insulation layer 14 side becomes a part of the second insulation layer 14.

Figure 6G:
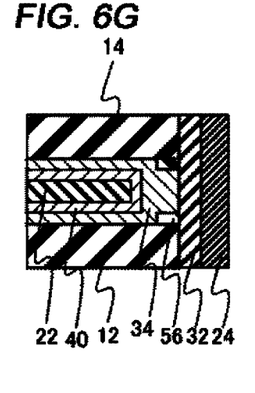

Subsequently, as illustrated in FIG. 6G, the first layer 34, a barrier metal 40, and the first conductive layer 22 are formed in the hole 68 to obtain the storage device of the second embodiment.

FIGS. 7A to 7H are schematic cross-sectional views illustrating a manufacturing method of the first modification of the storage device according to the second embodiment.

Figure 7A:
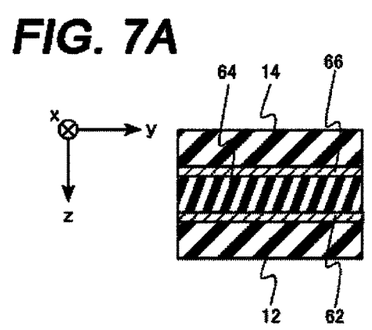
FIGS. 7A to 7H are schematic cross-sectional views illustrating a manufacturing method of the storage device according to a first modification of the second embodiment.

First, as illustrated in FIG. 7A, the first insulation layer 12, the first sacrificial layer 62, the second sacrificial layer 64, the third sacrificial layer 66, and the second insulation layer 14 are formed in this order.

Figure 7B:
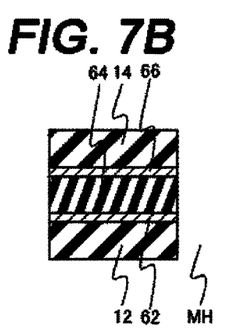

Subsequently, as illustrated in FIG. 7B, the memory hole MH is formed through the first insulation layer 12, the first sacrificial layer 62, the second sacrificial layer 64, the third sacrificial layer 66, the second insulation layer 14.

Figures 7C, 7D:
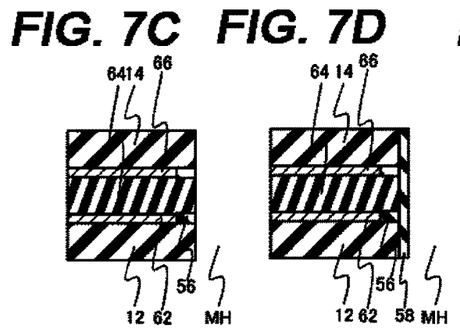

Subsequently, as illustrated in FIG. 7C, the side surface of the memory hole MH is oxidized using $H_2O$ gas or $O_2$ gas. Thereby, a portion of the first sacrificial layer 62 in contact with the memory hole MH and a portion of the third sacrificial layer 66 in contact with the memory hole MH are oxidized to form the first oxidized area 56. In addition, since a portion of the second sacrificial layer 64 in contact with the memory hole MH includes a nitride, it is not oxidized by $H_2O$ gas or $O_2$ gas.

Subsequently, as illustrated in FIG. 7D, a second oxidized area 58 including, for example, a silicon oxide is formed on the side surface of the memory hole MH by a chemical vapor deposition (CVD) method.

Subsequently, the variable resistance layer 32 is formed in the memory hole MH.

Figure 7E:
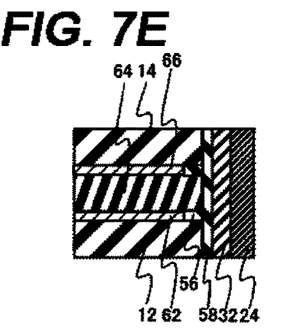

Subsequently, as illustrated in FIG. 7E, the second conductive layer 24 is formed in the memory hole MH in which the variable resistance layer 32 has been formed.

Figure 7F:
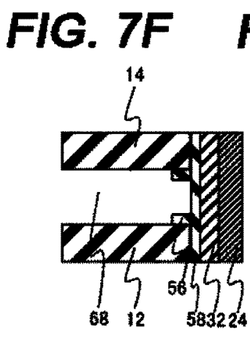

Subsequently, as illustrated in FIG. 7F, the first sacrificial layer 62, the second sacrificial layer 64, and the third sacrificial layer 66 are removed to form the hole 68.

Figure 7G:
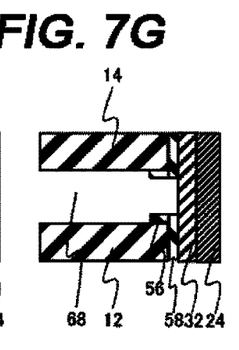

Subsequently, as illustrated in FIG. 7G, a portion of the second oxidized area 58 is removed by wet etching to expose the variable resistance layer 32.

Figure 7H:
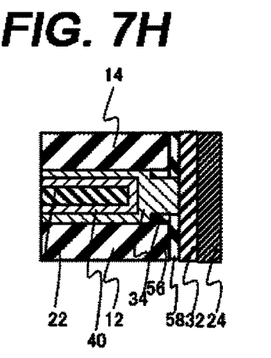
Figure 8A:
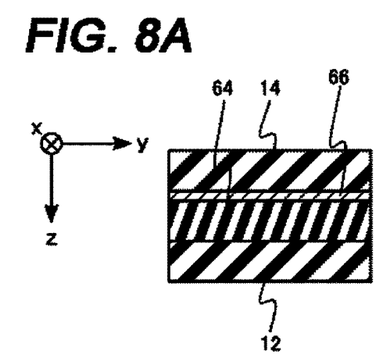
FIGS. 8A to 8H are schematic cross-sectional views illustrating a manufacturing method of the storage device according to a second modification of the second embodiment.
Figure 8B:
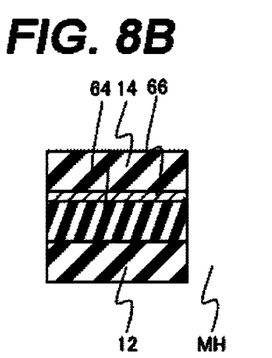
Figure 8C:
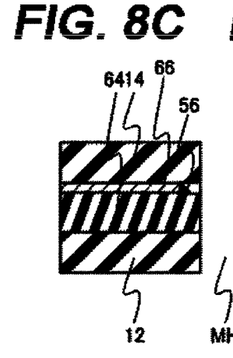
Figure 8D:
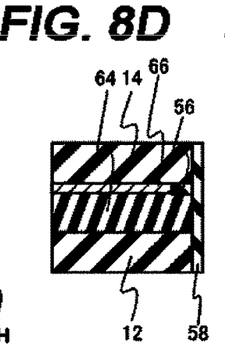
Figure 8E:
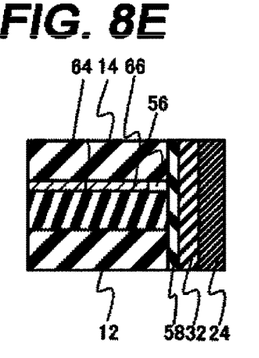
Figure 8F:
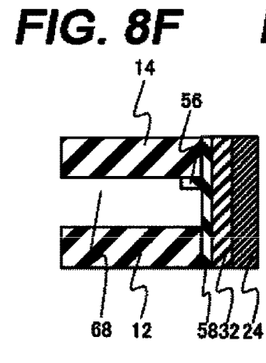
Figure 8G:
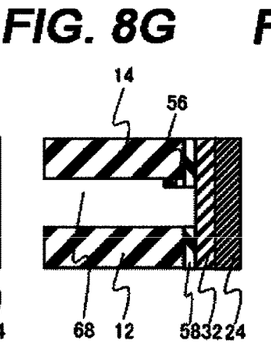
Figure 8H:
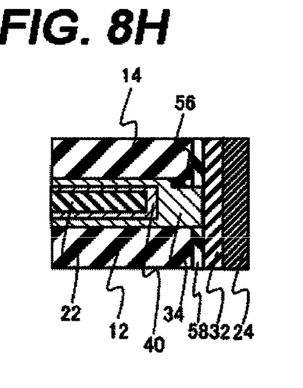

Subsequently, as illustrated in FIG. 7H, the first layer 34, the barrier metal 40, and the first conductive layer 22 are formed in the hole 68 to obtain the storage device of the second embodiment.

FIGS. 8A to 8H are schematic cross-sectional views illustrating a manufacturing method of the second modification 120 of the storage device according to the second embodiment. The manufacturing method of the second modification 120 is different from the method of manufacturing the storage device according to the second embodiment illustrated in FIGS. 6A to 6G in that the first sacrificial layer 62 is not formed.

Next, an action and effect of the storage device according to the second embodiment will be described.

In the storage device of the second embodiment, the first distance $L_1$ between the first insulation layer 12 and the second insulation layer 14 in the first area 52 is greater than the second distance $L_2$ between the first insulation layer 12 and the second insulation layer 14 in the second area 54, which is provided between the first area 52 and the variable resistance layer 32.

In other words, the first distance $L_1$ between the first insulation layer 12 and the second insulation layer 14 on a side distal to the variable resistance layer 32 is greater than the second distance $L_2$ between the first insulation layer 12 and the second insulation layer 14 on a side proximal to the variable resistance layer 32. This makes it possible to provide a storage device in which the memory cell current flowing through the memory cell MC is reduced relative to storage devices of the related art.

In particular, in a case of the memory cell MC in which a recording layer is provided around the memory hole MH, since the surface area of the recording layer on the surface of the memory hole MH is increased, there is a problem in that the memory cell current required for writing and reading is increased. With the storage device of the second embodiment, it may be possible to reduce the memory cell current relative to storage devices of the related art.

In the manufacturing method of the storage device according to the second embodiment, two kinds of materials having different oxidation rates are used as the sacrificial layers. Amorphous silicon is used for the first sacrificial layer 62 and the third sacrificial layer 66, and silicon nitride is used for the second sacrificial layer 64. Amorphous silicon is more easily oxidized than silicon nitride. Then, the second sacrificial layer 64 is provided between the first sacrificial layer 62 and the third sacrificial layer 66. Thereby, it is possible to manufacture the storage device 100 having a configuration in which the first distance $L_1$ between the first insulation layer 12 and the second insulation layer 14 in the first area 52 is greater than the second distance $L_2$ between the first insulation layer 12 and the second insulation layer 14 in the second region 54, which is provided between the first area 52 and the variable resistance layer 32. In addition, materials of the first sacrificial layer 62, the second sacrificial layer 64, and the third sacrificial layer 66 are not limited to the above.

With the storage device of the above-described embodiments, it is possible to provide a storage device with reduced memory cell current relative to storage devices of the related art.

Third Embodiment

The storage device of the third embodiment includes a first insulation layer extending in a first direction, a second insulation layer extending in the first direction, a first conductive layer extending in the first direction and provided between the first insulation layer and the second insulation layer, a second conductive layer extending in a second direction intersecting the first direction, and a first recording layer provided between the first conductive layer and the second conductive layer, wherein a first distance between the first insulation layer and the second insulation layer in a first area is greater than a second distance between the first insulation layer and the second insulation layer in a second area, which is provided between the first area and the first recording layer.

In addition, the storage device of the third embodiment includes a selection layer provided between the first conductive layer and the first recording layer.

Here, a description of the content overlapping the first embodiment is omitted.

Figure 9:
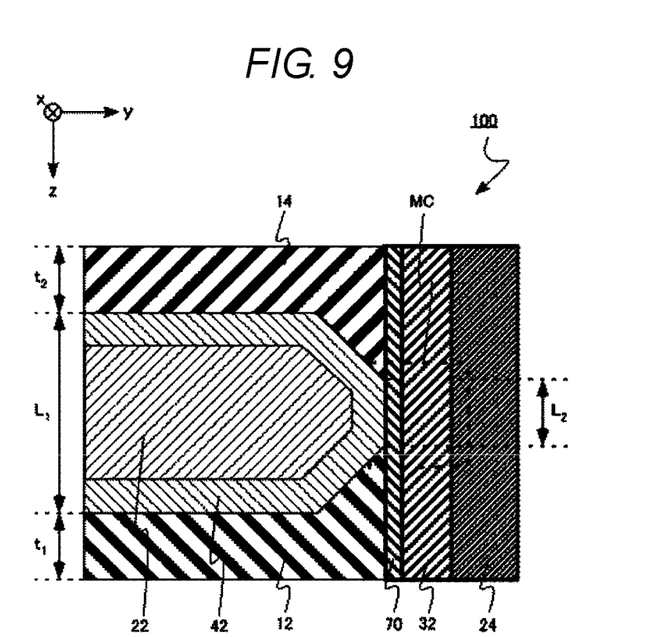
FIG. 9 is a schematic cross-sectional view of a part of a memory cell array of a storage device according to a third embodiment.

FIG. 9 is a schematic cross-sectional view of a major part of a storage device 200 according to the third embodiment.

The storage device 200 of the third embodiment is a phase change memory.

The variable resistance layer 32 is, for example, a chalcogenide layer. The variable resistance layer 32 is a chalcogenide layer including germanium (Ge), antimony (Sb), and tellurium (Te), for example. The variable resistance layer 32 is, for example, a Ge2Sb2Te5 alloy layer.

The selection layer 70 is provided between the first insulation layer 12 and the variable resistance layer 32, between the first conductive layer 22 and the variable resistance layer 32, and between the second insulation layer 14 and the variable resistance layer 32.

The selection layer 70 is a known as a selector, and prevents memory cell current from flowing to a memory cell MC that is not selected for writing/reading. The selection layer 70 is, for example, a chalcogenide layer, which includes arsenic (As), selenium (Se), germanium (Ge), and tellurium (Te), for example. The selection layer 70 includes, for example, AsSeGe.

A heating layer 42 is provided between the first insulation layer 12 and the first conductive layer 22, between the selection layer 70 and the first conductive layer 22, and between the second insulation layer 14 and the first conductive layer 22. The heating layer 42 is used for heating during the writing of the memory cell MC. The heating layer 42 includes, for example, titanium nitride. In addition, in a case where the heating layer 42 is formed of titanium nitride, the heating layer 42 also serves as a barrier metal layer.

With the storage device 200 of the third embodiment, it is possible to provide a storage device with reduced memory cell current relative to storage devices of the related art.

Fourth Embodiment

A storage device 300 of the fourth embodiment is different from that of the third embodiment in that the position of the selection layer is different. Here, a description of the content overlapping the first and third embodiments is omitted.

Figure 10:
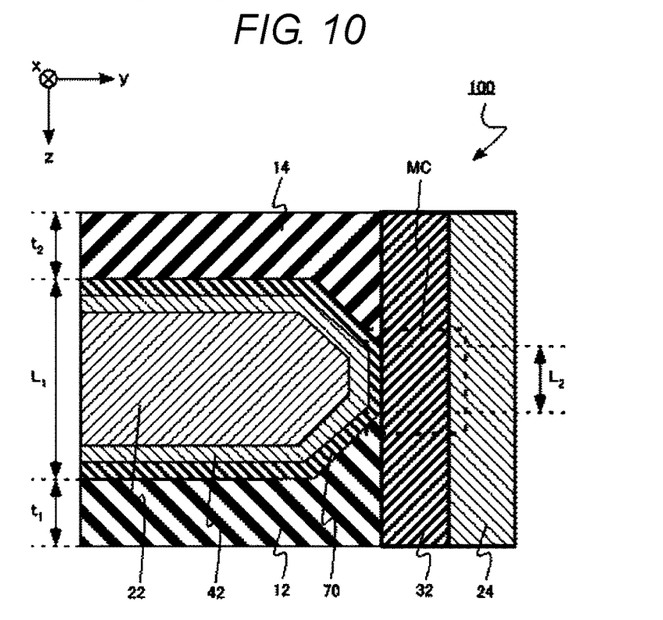
FIG. 10 is a schematic cross-sectional view of a part of a memory cell array of a storage device according to a fourth embodiment.

FIG. 10 is a schematic cross-sectional view of the storage device 300 according to the fourth embodiment.

The selection layer 70 is provided between the heating layer 42 and the first insulation layer 12, between the heating layer 42 and the variable resistance layer 32, and between the heating layer 42 and the second insulation layer 14.

With the storage device 300 of the fourth embodiment, it is possible to provide a storage device with reduced memory cell current relative to storage devices of the related art.

Fifth Embodiment

A storage device of the fifth embodiment includes a first insulation layer extending in a first direction, a second insulation layer extending in the first direction, a first conductive layer extending in the first direction and provided between the first insulation layer and the second insulation layer, a second conductive layer extending in a second direction intersecting the first direction, and a first recording layer provided between the first conductive layer and the second conductive layer, wherein a first distance between the first insulation layer and the second insulation layer in a first area is greater than a second distance between the first insulation layer and the second insulation layer in a second area, which is provided between the first area and the first recording layer.

In addition, the storage device of the fifth embodiment further includes an electrode member extending in the second direction and electrically connected to the first conductive layer, and a selection layer, the electrode member being provided between the selection layer and the first conductive layer.

Figure 11:
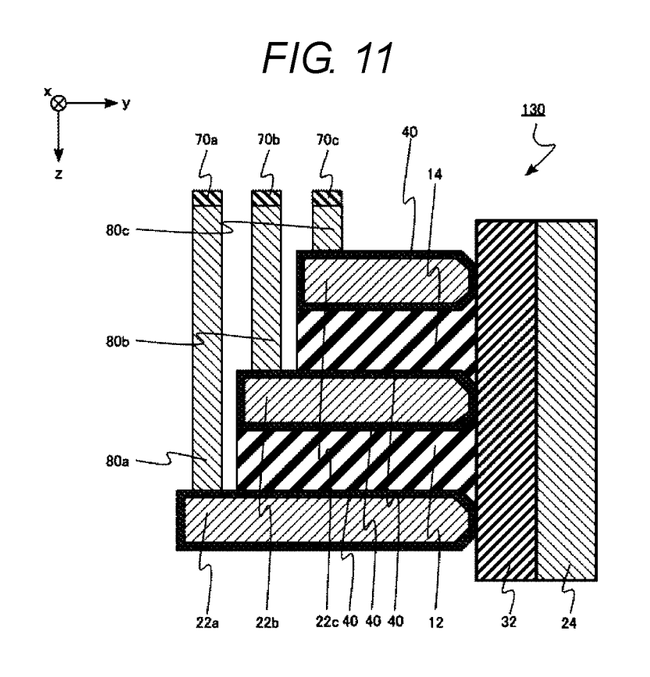
FIG. 11 is a schematic cross-sectional view of a part of a memory cell array of a storage device according to a fifth embodiment.

FIG. 11 is a schematic sectional view of a storage device 400 according to the fifth embodiment.

A first electrode member 80a extends in the second direction, and is electrically connected to a first conductive layer 22a via the barrier metal 40. A second electrode member 80b extends in the second direction, and is electrically connected to a second conductive layer 22b via the barrier metal 40. A third electrode member 80c extends in the second direction, and is electrically connected to a third conductive layer 22c via the barrier metal 40.

A first selection layer 70a is provided on the first electrode member 80a. In other words, the first electrode member 80a is provided between the first selection layer 70a and the first conductive layer 22a.

A second selection layer 70b is provided on the second electrode member 80b. In other words, the second electrode member 80b is provided between the second selection layer 70b and the second conductive layer 22b.

A third selection layer 70c is provided on the third electrode member 80c. In other words, the third electrode member 80c is provided between the third selection layer 70c and the third conductive layer 22c.

In the storage device 400 of the fifth embodiment, the first selection layer 70a, the second selection layer 70b, and the third selection layer 70c are not provided in the memory cell MC or in the vicinity of the memory cell MC but provided on the electrode members. This makes it possible to form the selection layer by a sputtering method, for example. Therefore, it is possible to provide a storage device, which is easy to manufacture relative to storage devices of the related art.

In addition, in FIG. 11, the numbers of electrode members, selection layers and conductive layers are three respectively. However, the numbers of electrode members, selection layers, and conductive layers are not limited thereto.

With the storage device of the fifth embodiment, it is possible to provide a storage device, which is easy to manufacture and has reduced memory cell current relative to storage devices of the related art.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising: a substrate; a first insulation layer extending in a first direction; a second insulation layer extending in the first direction; a first conductive layer extending in the first direction and provided between the first insulation layer and the second insulation layer in a second direction perpendicular to the substrate and intersecting the first direction; a second conductive layer extending in the second direction; a variable resistance layer provided between the first conductive layer and the second conductive layer; and a first layer including a first surface in contact with the first insulation layer and a second surface contiguous with the first surface and in contact with the variable resistance layer in a third direction intersecting the first direction and the second direction, wherein the first surface has an incline with respect to the third direction from a first portion to a second portion that is closer to the second surface than the first portion, such that a part of the first insulation layer is between the first portion and the variable resistance layer in the third direction and a first distance between the first portion and the second insulation layer in the second direction is larger than a second distance between the second portion and the second insulation layer.

2. The storage device according to claim 1, wherein the first layer extends in the first direction and is between the first conductive layer and the first insulation layer in the second direction and between the first conductive layer and the second insulation layer in the second direction.

3. The storage device according to claim 1, further comprising a selection layer, which selectively blocks current from flowing therethrough, between the first conductive layer and the variable resistance layer.

4. The storage device according to claim 3, wherein the selection layer is a chalcogenide layer.

5. The storage device according to claim 3, wherein the selection layer is between the first insulation layer and the variable resistance layer.

6. The storage device according to claim 3, wherein the first insulation layer is between the selection layer and the variable resistance layer.

7. The storage device according to claim 1, wherein a distance between the first portion and the variable resistance layer is greater than a distance between the second portion and the variable resistance layer.

8. The storage device according to claim 1, wherein
the first layer further includes a third surface contiguous with the second surface and spaced apart from the first surface, and
the second insulation layer is provided between the third surface and the variable resistance layer.

9. The storage device according to claim 8, wherein the third surface has an incline with respect to the third direction from a third portion to a fourth portion that is closer to the second surface than the third portion, such that a part of the second insulation layer is between the third portion and the resistance-variable layer in the third direction and a third distance between the third portion and the first insulation layer in the second direction is larger than a fourth distance between the fourth portion and the first insulation layer.

10. The storage device according to claim 1, wherein the first layer is a semiconductor layer.

11. A storage device comprising:
a substrate;
a first conductive layer extending in a first direction;
a second conductive layer that extends in a second direction perpendicular to the substrate and intersecting the first direction, and is spaced apart from the first conductive layer in a third direction, which intersects the first direction and the second direction;
a variable resistance layer provided between the first conductive layer and the second conductive layer; and
a first layer provided between the first conductive layer and the variable resistance layer in the third direction, wherein
the storage device is configured to store information based on variation in a resistance value of the second conductive layer in the second direction, which is based on variation in a resistance value of an area between the first conductive layer and the second conductive layer caused by applying a voltage across the first conductive layer and the second conductive layer, and
a length of the first layer in the second direction at a first portion that is closer to the first conductive layer than the second conductive layer is larger than at a second portion that is closer to the second conductive layer than the first conductive layer.

12. The storage device according to claim 11, wherein the first layer at the second portion is between a first insulating layer and a second insulating layer in the second direction, and parts of the first and second insulating layers are between the first portion and the second conductive layer in the third direction.

13. The storage device according to claim 12, wherein the first layer is between the first insulating layer and the first conductive layer and between the second insulating layer and the first conductive layer.

14. The storage device according to claim 11, further comprising a selection layer, which selectively blocks current from flowing therethrough, between the first conductive layer and the variable resistance layer.

15. The storage device according to claim 14, wherein the selection layer is a chalcogenide layer.

16. A storage device comprising: a substrate; a first insulation layer; a second insulation layer; a first conductive layer extending in a first direction and provided between the first insulation layer and the second insulation layer; a second conductive layer extending in a second direction intersecting the first direction; and a recording layer provided between the first conductive layer and the second conductive layer, wherein a first distance between the first insulation layer and the second insulation layer in a first area including first parts of the first insulation layer, the first conductive layer, and the second insulation layer, is greater than a second distance between the first insulation layer and the second insulation layer in a second area including second parts of the first insulation layer, the first conductive layer, and the second insulation layer, that is between the first area and the recording layer.

17. The storage device according to claim 16, wherein the recording layer is a variable resistance layer.

18. The storage device according to claim 16, further comprising:
a first layer between the first insulation layer and the first conductive layer, between the first conductive layer and the recording layer, and between the first conductive layer and the second insulation layer.

19. The storage device according to claim 18, wherein the first layer is a semiconductor layer.

20. The storage device according to claim 18, wherein the first layer is a metal nitride layer or a barrier metal layer.

\* \* \* \* \*